United States Patent
Folick et al.

(10) Patent No.: US 11,987,149 B2
(45) Date of Patent: May 21, 2024

(54) SYSTEM AND METHOD FOR REDUCING BATTERY OVERCONSUMPTION IN A FUEL CELL SYSTEM

(71) Applicant: Toyota Motor Engineering & Manufacturing North America, Inc., Plano, TX (US)

(72) Inventors: Daniel Charles Folick, Long Beach, CA (US); Christopher M. Bulpitt, Los Angeles, CA (US); Jared Farnsworth, San Francisco, CA (US); Andrew Sata, Irvine, CA (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 373 days.

(21) Appl. No.: 17/405,841

(22) Filed: Aug. 18, 2021

(65) Prior Publication Data
US 2023/0060085 A1 Feb. 23, 2023

(51) Int. Cl.
*B60L 58/40* (2019.01)
*G01R 31/382* (2019.01)

(52) U.S. Cl.
CPC ............ *B60L 58/40* (2019.02); *G01R 31/382* (2019.01); *H01M 2250/20* (2013.01)

(58) Field of Classification Search
CPC ....................................................... B60L 58/40
USPC ....................................................... 320/132
See application file for complete search history.

(56) References Cited

U.S. PATENT DOCUMENTS

| 5,991,670 A | 11/1999 | Mufford et al. |
| 7,247,401 B2 * | 6/2007 | Aberle et al. ....... H01M 16/003 |
| | | 429/22 |
| 7,449,259 B2 | 11/2008 | Zhu et al. |

(Continued)

FOREIGN PATENT DOCUMENTS

| JP | 2003324853 | * 11/2003 | ............. B60L 11/18 |
| JP | 2003324853 A | 11/2003 | |

OTHER PUBLICATIONS

European Search Report dated Apr. 18, 2023 for EP 22191024 filed Aug. 18, 2022.

(Continued)

*Primary Examiner* — Edward Tso
*Assistant Examiner* — Ahmed H Omar
(74) *Attorney, Agent, or Firm* — SNELL & WILMER LLP

(57) ABSTRACT

A system for reducing overconsumption of power in a vehicle includes a power source including a battery having a state of charge (SOC), and a fuel cell stack that generates electricity. The system further includes an electronic control unit (ECU) coupled to the power source and designed to receive a power request corresponding to a requested amount of power from the power source. The ECU is further designed to determine a fuel cell power amount corresponding to an amount of the electricity generated by the fuel cell stack to achieve the requested amount of power. The ECU is further designed to determine an overconsumption event when a current power consumption corresponding to a total amount of power being drawn from the power source is greater than the power request. The ECU is further designed to increase the fuel cell power amount in response to determining the overconsumption event.

20 Claims, 10 Drawing Sheets

(56) References Cited

U.S. PATENT DOCUMENTS 8,642,222 B2     4/2014    Schaffnit et al.
2010/0255393 A1   10/2010   Imai

OTHER PUBLICATIONS

Xu, Liangfei, Minggao Ouyang, Jianqiu Li, Haiyan Huang, Fuyuan Yang, and Quanquan Gan. "Closed loop control algorithm of fuel cell output power for a city bus." SAE International Journal of Alternative Powertrains 2, No. 1 (2013): 74-81.

* cited by examiner

SYSTEM AND METHOD FOR REDUCING BATTERY OVERCONSUMPTION IN A FUEL CELL SYSTEM

BACKGROUND

1. Field

The present disclosure relates to systems and methods for reducing the likelihood of overdrawing power from a battery of a vehicle, the battery and a fuel cell stack being provided separately from additional vehicle components.

2. Description of the Related Art

Due to changing regulations and incentives, many vehicles have been moving away from use of fossil fuels and towards electrical power. These vehicles may include a motor-generator that converts electrical energy into torque. These vehicles may use a battery to store the electrical power as well as a fuel cell circuit to generate additional electrical power. Some manufacturers have been on the leading edge of this change to electrical power and may manufacture power sources that include a fuel cell circuit and a battery that operate together as a power source.

Other manufacturers may have expertise in other areas of the vehicle, such as in engines, chassis or body design, or the like. In that regard, the electrical power sources may be provided as an original equipment manufacturer (OEM) part into existing vehicles. This integration may present challenges such as miscommunications between an electronic control unit (ECU) of the vehicle and an ECU designed to control the power source. Components of the power source may experience undesirable results from this miscommunication such as the vehicle drawing more electrical power than it requests, thus causing a state of charge (SOC) of the battery to drop to or below a predetermined minimum SOC threshold. This mismatch between the requested power and the actual power draw may further cause the SOC to become sufficiently low that it is incapable of proper operation.

Thus, there is a need in the art for systems and methods for controlling an electrical power source to generate power for separate vehicle components in such a way as to overcome the challenges of these miscommunications.

SUMMARY

Described herein is a system for reducing overconsumption of power from a vehicular power source. The system includes a power source including: a battery configured to store energy and having a state of charge (SOC), and a fuel cell stack configured to generate electricity at least one of to be utilized by a motor or to be stored in the battery. The system further includes a power source electronic control unit (ECU) coupled to the power source. The power source ECU is designed to receive a power request corresponding to a requested amount of power from the power source. The power source ECU is further designed to determine a fuel cell power amount corresponding to an amount of the electricity generated by the fuel cell stack to achieve the requested amount of power. The power source ECU is further designed to determine an overconsumption event when a current power consumption corresponding to a total amount of power being drawn from the power source is greater than the power request. The power source ECU is further designed to increase the fuel cell power amount in response to determining the overconsumption event.

Also described is a system for reducing overconsumption of power from a vehicular power source. The system includes a motor configured to convert electricity into mechanical power. The system further includes a power source including: a battery configured to store energy and having a state of charge (SOC), and a fuel cell stack configured to generate electricity at least one of to be utilized by the motor or to be stored in the battery. The system further includes a vehicle electronic control unit (ECU) coupled to the motor and configured to control operation of the motor and to generate a power request corresponding to a requested amount of power from the power source. The system further includes a power source ECU coupled to the power source and the vehicle ECU. The power source ECU is designed to receive the power request from the vehicle ECU. The power source ECU is further designed to determine a fuel cell power amount corresponding to an amount of the electricity generated by the fuel cell stack to achieve the requested amount of power. The power source ECU is further designed to determine an overconsumption event when a current power consumption corresponding to a total amount of power being drawn from the power source is greater than the power request. The power source ECU is further designed to increase the fuel cell power amount in response to determining the overconsumption event.

Also described is a method for reducing overconsumption of power from a vehicular power source. The method includes storing, in a battery, energy. The method further includes generating, by a fuel cell stack, electricity to be at least one of utilized by a motor or stored in the battery, the battery and the fuel cell stack together being a power source. The method further includes receiving, by a power source electronic control unit (ECU), a power request corresponding to a requested amount of power from the power source. The method further includes determining, by the power source ECU, a fuel cell power amount corresponding to an amount of the electricity generated by the fuel cell stack to achieve the requested amount of power. The method further includes determining, by the power source ECU, an overconsumption event when a current power consumption corresponding to a total amount of power being drawn from the power source is greater than the power request. The method further includes increasing, by the power source ECU, the fuel cell power amount in response to determining the overconsumption event.

BRIEF DESCRIPTION OF THE DRAWINGS

Other systems, methods, features, and advantages of the present invention will be or will become apparent to one of ordinary skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

The present disclosure describes systems and methods for reducing the likelihood of overconsumption of power from a vehicle power source. The systems provide various benefits and advantages such as reducing the likelihood of a state of charge (SOC) of a battery from reaching or dropping below a minimum SOC threshold. This, in turn, advantageously allows the battery to remain available to supplement power generated by the fuel cell circuit to ensure that supplemental power remains available when needed. The systems provide the additional benefit of determining the overconsumption event based on either a direct measurement of the system power draw, or by calculating the total system power draw as the summation of all fuel cells and batteries within the system. The systems may advantageously provide these benefits in vehicles in which the power source is provided separately from other vehicle components, making miscommunications between the power source and the additional vehicle components a reality.

An exemplary system includes a power source having a battery and a fuel cell circuit. The system also includes a power source ECU. The power source ECU receives a power request indicating an amount of power to be provided by the power source. The power source ECU also determines a fuel cell power amount indicating the amount of electricity for the fuel cell to generate to achieve the power request. The power source ECU determines an overconsumption event when a current power consumption is greater than the power request. In response to determining the overconsumption event, the power source ECU controls the fuel cell to increase its power generation, thus preventing this additional power from coming out of the battery.

Figure 1:
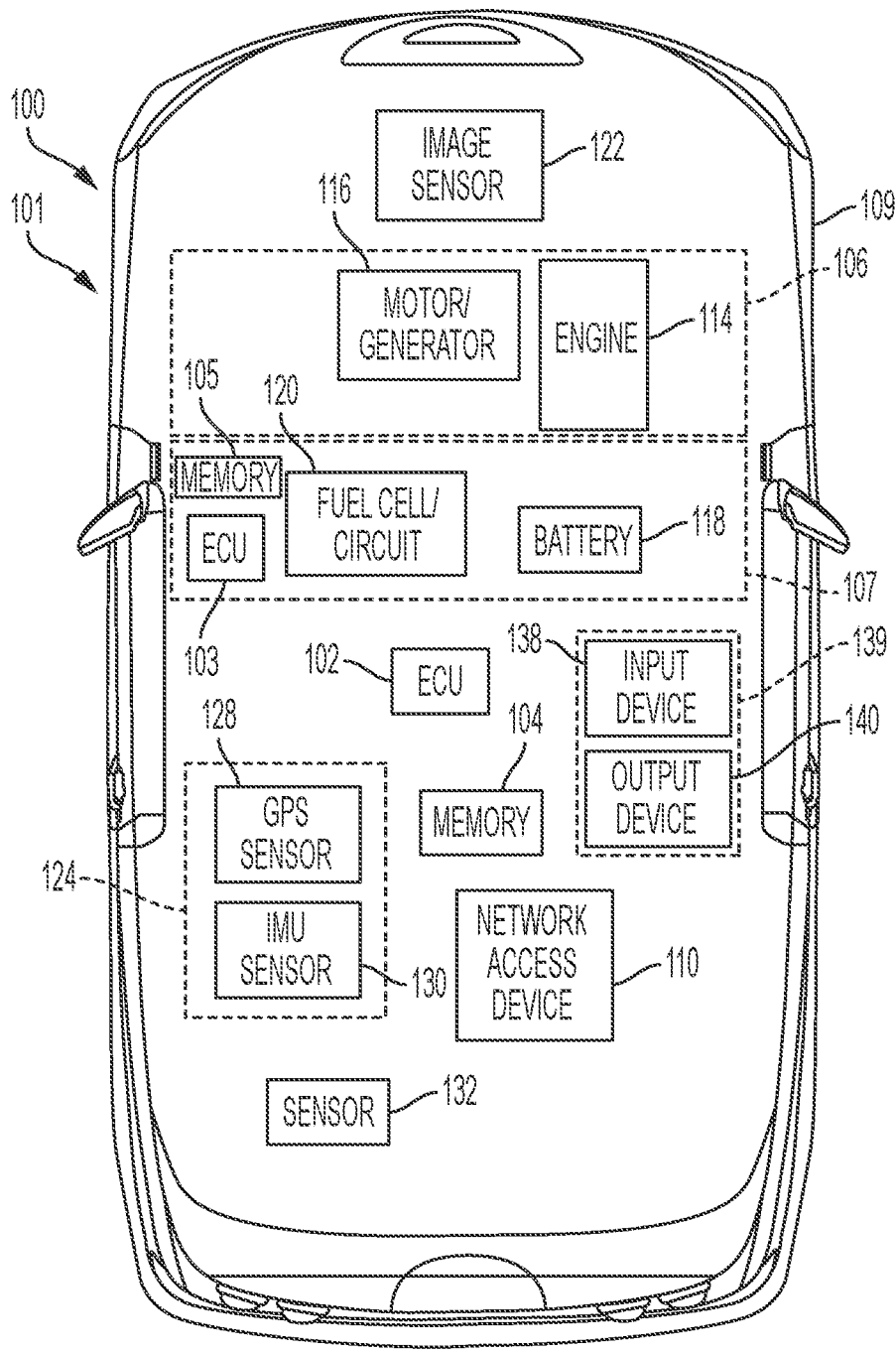
FIG. 1 is a block diagram illustrating a vehicle having a system for reducing power overdraw and power overconsumption according to an embodiment of the present invention.

Turning to FIG. 1, a vehicle 100 may include a system 101 for reducing overconsumption of electrical power and for reducing the likelihood of overdraw of electrical power. The vehicle 100 (or system 101) may include a vehicle ECU 102, a power source ECU 103, a memory 104, a torque source 106, a power source 107, and a main body 109. The vehicle 100 (or system 101) may further include a network access device 110, an image sensor 122, a location sensor 124, and a sensor 132. The vehicle 100 may also include an input device 138 and an output device 140, which together may be referred to as an IVI interface 139.

The main body 109 may be propelled along a roadway, may be suspended in or on water, or may fly through air. The main body 109 may resemble a vehicle such as a car, a bus, a motorcycle, a boat, an aircraft, a stationary generator, or the like. The main body 109 may further support one or more individuals such as a driver, a passenger, or the like. The main body 109 may define or include a vehicle cabin 111 in which a driver, passengers, or the like may be located.

The vehicle ECU 102 may be coupled to each of the components of the vehicle 100 (with the exception of the power source 107) and may include one or more processors or controllers which may be specifically designed for automotive systems. The functions of the vehicle ECU 102 may be implemented in a single ECU or in multiple ECUs. For example, the vehicle ECU 102 may include a torque ECU that controls the torque source 106, an IVI ECU that controls the IVI interface 139, or the like. The vehicle ECU 102 may receive data from components of the vehicle 100, may make determinations based on the received data, and may control the operations of the components based on the determinations. For example, the vehicle ECU 102 may receive a power request from an acceleration pedal or a brake request from a brake pedal (as well as any additional electrical power requested or required by electronic devices such as the location sensor 124), may determine a requested amount of power to meet the power request, and may output the requested amount of power to the power source ECU 103. The vehicle ECU 102 may cause some received power to go to the torque source 106 which may convert the received power into torque to drive the vehicle 100, and may cause additional power to go to the electronic devices to power the electronic devices.

The vehicle 100 may be non-autonomous, fully autonomous, or semi-autonomous. In that regard, the vehicle ECU 102 may control various aspects of the vehicle 100 (such as steering, braking, accelerating, or the like) to maneuver the vehicle 100 from a starting location to a destination. In some embodiments, the vehicle 100 may be operated in an autonomous, semi-autonomous, or fully driver-operated state. In that regard, the vehicle 100 may be operated independently of driver control and, from time to time, without a person inside of the vehicle 100. The vehicle ECU 102 may facilitate such autonomous functionality. The vehicle ECU 102 may also, for example, control various aspects of the mobile device 152 via instructions received from the IVI 139.

The power source ECU 103 may be coupled to each component of the power source 107 and may include one or more processors or controllers which may be specifically designed for automotive systems. The functions of the power source ECU 103 may be implemented in a single ECU or in multiple ECUs. The power source ECU 103 may control the power source 107 to at least one of generate or output electrical power to meet the power request received from the vehicle ECU 102.

The memory 104 may include any non-transitory memory and may store data usable by the vehicle ECU 102. For example and as described in more detail below, the memory 104 may store a list of accessory locks which are to be controlled along with the door locks 154, 156. The memory 104 may be located in or on the main body 109 and may thus be referred to as a local memory. In some embodiments, the memory 104 may be located remote from the main body 109 and may thus be a remote memory.

In some embodiments, the power source ECU 103 may include a non-transitory memory 105 that is separate from the memory 104. The power source memory 105 may store data usable by the power source ECU 102 to control operation of the power source 107.

The torque source 106 may include any one or more of an engine 114 or a motor-generator 116. The power source 107 may include any one or more of a battery 118 or a fuel cell circuit 120. As referenced above, the vehicle ECU 102 may control operation of the torque source 106 (including the engine 114 and the motor-generator 116), and the power source ECU 103 may control operation of the power source 107 (including the battery 118 and fuel cell circuit 120).

The engine 114 may convert a fuel into mechanical power for propelling the vehicle 100. In that regard, the engine 114 may be a gasoline engine, a diesel engine, an ethanol engine, or the like.

The motor-generator 116 may convert the electrical energy stored in the battery 118 (or electrical energy received directly from the fuel-cell circuit 120) into mechanical power usable to propel the vehicle 100. The motor-generator 116 may further convert mechanical power received from the engine 114 or from wheels of the vehicle 100 into electricity, which may be stored in the battery 118 as energy and/or used by other components of the vehicle 100. In some embodiments, the motor-generator 116 may include a motor without a generator portion and, in some embodiments, a separate generator may be provided.

The battery 118 may store electrical energy. In some embodiments, the battery 118 may include any one or more energy storage device including a battery, a flywheel, a super capacitor, a thermal storage device, or the like. The battery 118 may be used to store power usable by the motor generator 116, power usable to start the engine 114, or the like.

The fuel-cell circuit 120 may include a plurality of fuel cells (e.g., one or more fuel cell stack) that facilitate a chemical reaction to generate electrical energy along with a system or systems for providing hydrogen and oxygen (or any other compounds). For example, the fuel cells may receive hydrogen and oxygen, facilitate a reaction between the hydrogen and the oxygen, and output electricity in response to the reaction. In that regard, the electrical energy generated by the fuel-cell circuit 120 may be stored in the battery 118 and/or used by the motor-generator 116 or other electrical components of the vehicle 100. In some embodiments, the vehicle 100 may include multiple fuel-cell circuits including the fuel-cell circuit 120.

The location sensor 124 may include any sensor capable of detecting data corresponding to a current location of the vehicle 100. For example, the location sensor 124 may include one or more of a global positioning system (GPS) sensor 128, an inertial measurement unit (IMU) sensor 130, or the like. The GPS sensor 128 may detect data corresponding to a location of the vehicle. For example, the GPS sensor 128 may detect global positioning coordinates of the vehicle 100. The IMU sensor 130 may include one or more of an accelerometer, a gyroscope, or the like. The IMU sensor 130 may detect inertial measurement data corresponding to a position, a velocity, an orientation, an acceleration, or the like of the vehicle 100. The inertial measurement data may be used to identify a change in location of the vehicle 100, which the vehicle ECU 102 may track in order to determine a current location of the vehicle 100.

The image sensor 122 may be coupled to the main body 108 and may detect image data corresponding to an environment of the vehicle 100, data corresponding to the vehicle cabin 111, or the like. For example, the image sensor 122 may include a camera, a radar detector, a lidar detector, or any other image sensor capable of detecting light having any wavelength. The image sensor 122 may include one or multiple image sensors which may be oriented to detect image data in any direction relative to the main body 109 (and/or within the vehicle cabin 111). For example, the image sensor 122 may include four or more radar detectors to detect radar data on all four sides of the main body 109. The image sensor 122 may also or instead include a first camera to detect image data in a forward direction relative to the main body 109 and a second camera to detect image data in a rear direction relative to the main body 109.

The sensor 132 may include one or more sensor capable of detecting a status of a vehicle component. For example, the sensor 132 may include a voltage sensor, a current sensor, a power sensor, an SOC sensor, or the like. The sensor 132 may detect data corresponding to power output by one or more component of the power source 107, power drawn by one or more component of the torque source 106, or the like. For example, the sensor 132 may detect an amount of electrical current drawn from the power source 107 by the motor-generator 116. As another example, the sensor 132 may detect a SOC of the battery 118, which may be used to interpret a total power draw from the power source 107 (e.g., the power source ECU 103 may determine the power draw based on the change in SOC and based on an amount of power generated by the fuel cell circuit 120).

The input device 138 may include any one or more input device such as a button, a keyboard, a mouse, a touchscreen, a microphone, or the like. The input device 138 may receive input from a user of the vehicle 100 such as a driver or a passenger. The input device 138 may receive, for example, information corresponding to a request for cruise control, information usable to control an auxiliary component of the vehicle 100 (e.g., to control a navigation device or a stereo), or the like. In some embodiments, the input device 138 may include additional input devices usable to control the vehicle 100 such as an accelerator pedal, a brake pedal, a steering wheel, or the like. The input device 138 may also or instead receive information corresponding to a request for the vehicle 100 to drive autonomously.

The output device 140 may include any output device such as a speaker, a display, a touchscreen, or the like. The output device 140 may output data to a user of the vehicle. The output device 140 may, for example, output information corresponding to autonomous control of the vehicle 100.

The network access device 110 may include any network access device capable of communicating via a wireless protocol. For example, the network access device 110 may communicate via Bluetooth, Wi-Fi, a cellular protocol, vehicle-to-vehicle (V2V) communications, Zigbee, or any other wireless protocol. The network access device 110 may be referred to as a data communication module (DCM) and may communicate with any device on the vehicle 100 and/or any remote device.

The power source 107 (potentially including the power source ECU 103) may be implemented in a vehicle that is manufactured separately from the power source 107. For example, the power source 107 may be manufactured by a first vehicle manufacturer and may be an original equipment manufacturer (OEM) system that is incorporated into a vehicle manufactured by a second, different vehicle manufacturer. This arrangement, where the power source 107 is an OEM system incorporated into a separate vehicle, presents challenges that do not exist in conventional vehicle designs (i.e., in vehicles in which all power and torque sources are manufactured together). If a power source and torque source are designed and manufactured together, then a single ECU or a family of ECUs may control the power and torque sources as a single system. However, in the present arrangement, the vehicle ECU 102 may be incapable of controlling the power source 107 and the power source ECU 103 may be incapable of controlling the torque source 106.

This separation of the power source 107 and the torque source 106 (and additional components such as auxiliary components) presents challenges such as situations in which the torque source requests less power than it actually consumes. In such a situation, a state of charge (SOC) of the battery 118 may be overconsumed such that the SOC reaches a minimum SOC and becomes incapable of providing extra power when requested. If the overconsumption continues past this point, the battery SOC may be overdrawn below the minimum SOC (i.e., to a SOC at or near 0%), which may cause the entire power source 107 to become incapable of providing any power to the torque source 106. Overconsuming and overdrawing the SOC from the battery are both undesirable situations. In that regard, the power source ECU 107 is capable of controlling the power source 107 to reduce or eliminate the likelihood of overconsumption or overdraw of power from the battery 118, as will be discussed in further detail below.

Figure 2:
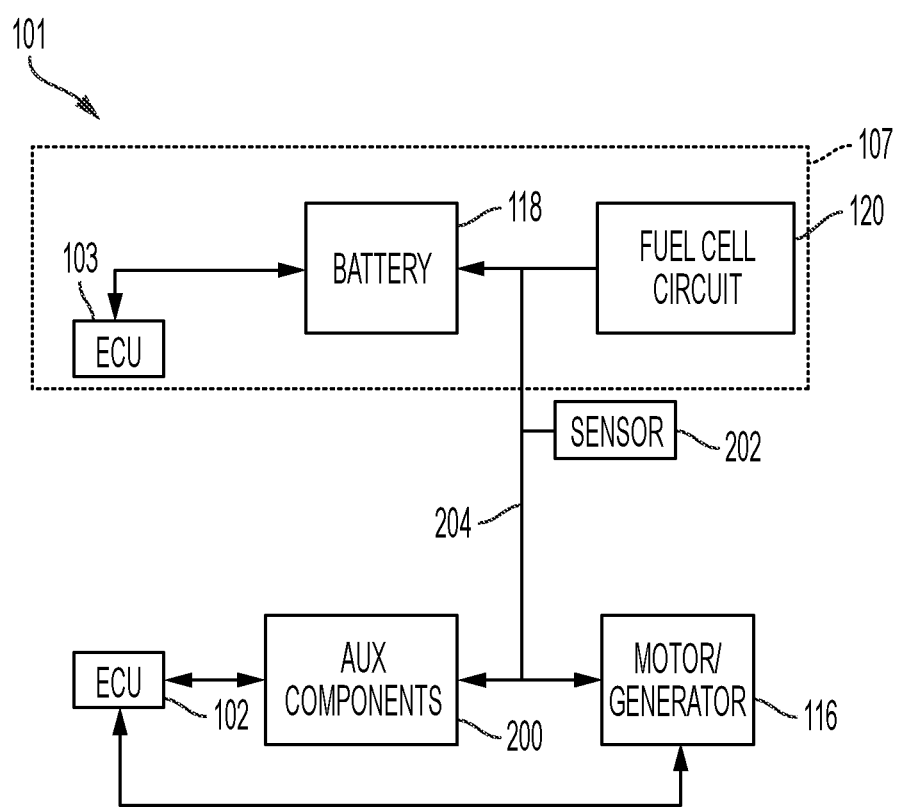
FIG. 2 is a block diagram illustrating additional features of the system of FIG. 1 according to an embodiment of the present invention.

Referring now to FIGS. 1 and 2, a block diagram illustrating a system in which the power source 107 is provided separately from other components of the vehicle 100 is shown. As shown, the power source 107 includes the power source ECU 103, the battery 118, and the fuel cell circuit 120. The vehicle ECU 102 may be separate from the power source 107 and may communicate with (and control) the motor-generator 116 as well as auxiliary components 200 (such as the location sensor 124, an audio system, a navigation system, or the like). An electrical bus 204 may be present between the power source 107 and the additional vehicle components. In particular, the electrical bus may be coupled to the battery 118 and the fuel cell circuit 120 along with the motor-generator 116 and the auxiliary components 200. A power sensor 202 (which may be the same or different than the sensor 132) may be coupled to the bus 204 between the power source 107 and the remaining vehicle components. The power sensor 202 may detect a voltage, a current, a power, or the like that is transferred along the bus 204, or any other information usable to determine or predict an amount of power on the bus 204. The power source ECU 103 may calculate, determine, or predict an amount of power that is transferred from the power source 107 to the remaining vehicle components based on the data detected by the sensor 202.

As referenced above, the power source ECU 103 may be designed to reduce or eliminate the likelihood of overconsuming or overdrawing power from the power source 107. Without such capabilities, problems not present in conventional vehicles may arise. For example and referring to FIG. 3, a chart 301 illustrates results of overconsuming power from a power source provided separately from additional vehicle components when the power source fails to include overconsumption protection.

A first line 300 illustrates an actual amount of power drawn by vehicle components (e.g., auxiliary components and a motor-generator). A second line 302 illustrates both an amount of power requested from the vehicle components along with an amount of power generated by the fuel cell circuit (the battery may be used to provide supplemental power but it may be desirable for the fuel cell circuit to be designed to provide as much of the requested power as possible). A third line 306 illustrates an amount of power that is allowed to be drawn from the battery. The battery allowed power is an amount of power that a power source ECU will allow to be drawn from the battery that reduces the likelihood of the ECU reaching or dropping below a minimum SOC threshold 314. The minimum SOC threshold 314 corresponds to a SOC level below which the battery may degrade or otherwise become damaged or unusable. A fourth line 308 illustrates a current SOC of the battery.

As referenced above, the battery may supplement power generated by the fuel cell circuit 302 in situations in which the actual power draw 300 is greater than the requested power draw 302. The battery may also supplement power in situations in which the fuel cell circuit 302 takes a period of time to ramp up power output (e.g., the battery provides supplemental power while the fuel cell output power increases to the fuel cell requested power). However, if this situation continues for a sufficient period of time, the battery allowed power 306 may become reduced to zero. In particular, the actual power draw 300 remains greater than the fuel cell generated power 302 for the duration of the example shown in FIG. 3. Thus, the difference in power between the generated power 302 and the actual power draw 300 is provided by the battery.

While the current SOC of the battery 308 remains above the minimum SOC threshold 314, the battery allowed power 306 may remain relatively constant and the battery may continue providing the difference in power between the generated power 302 and the actual power draw 300. However, at a first time 310, the current SOC 308 approaches the minimum SOC threshold 314, causing the battery allowed power 306 to reduce. At a second time 213, the actual SOC of the battery 308 reaches the minimum SOC threshold 314 and the battery allowed power 306 becomes reduced to zero. The situation in which the SOC reaches the minimum SOC threshold 314 and the battery allowed power 306 reaches zero may be referred to as overconsumption of power from a power source. This overconsumption is undesirable because the battery becomes unavailable to supplement power provided by the fuel cell circuit, which may result in the vehicle becoming unresponsive to a request for acceleration.

Figure 4A:
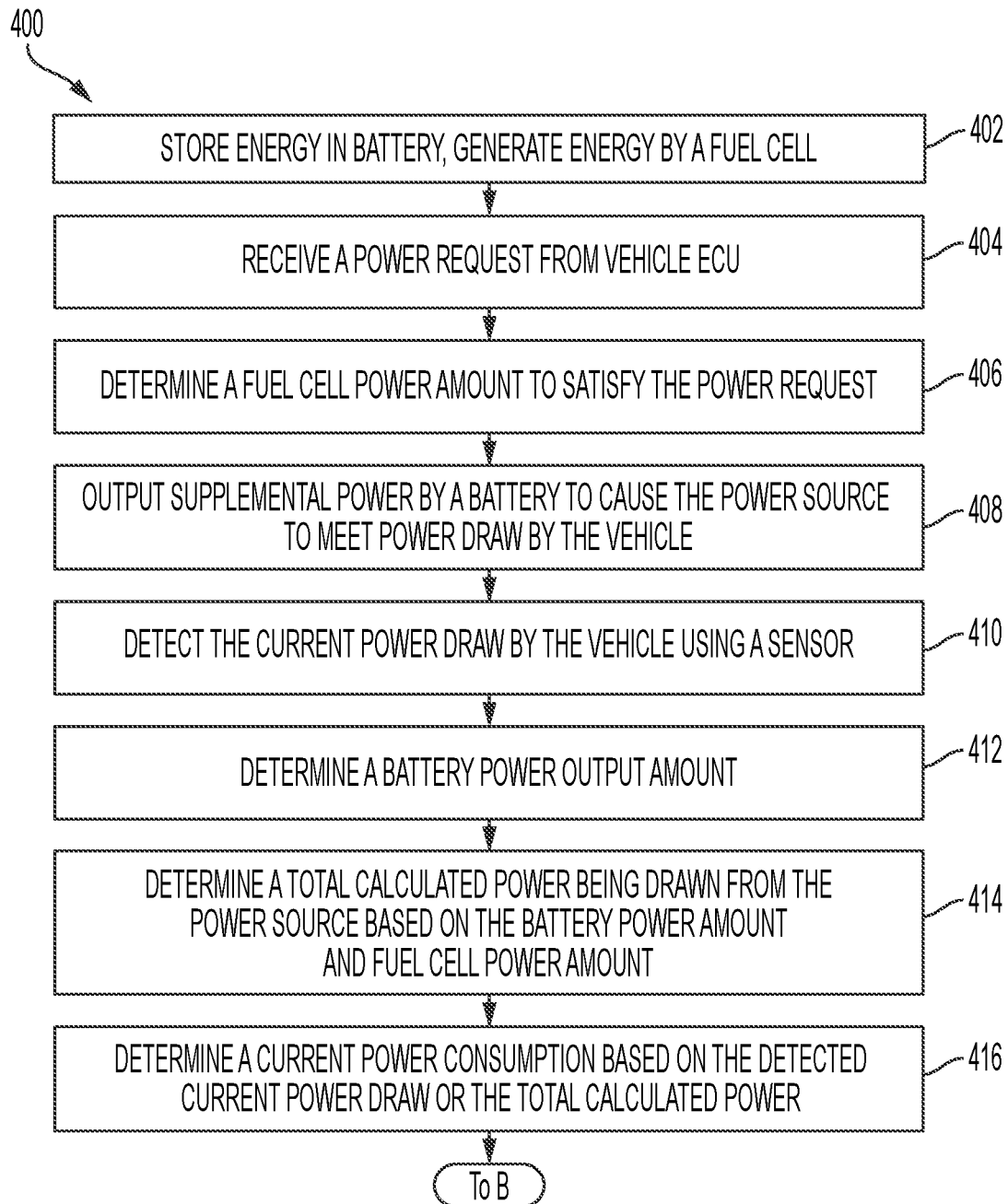
FIGS. 4A and 4B are flowcharts illustrating a method for reducing power overconsumption in a vehicle according to an embodiment of the present invention.
Figure 4B:
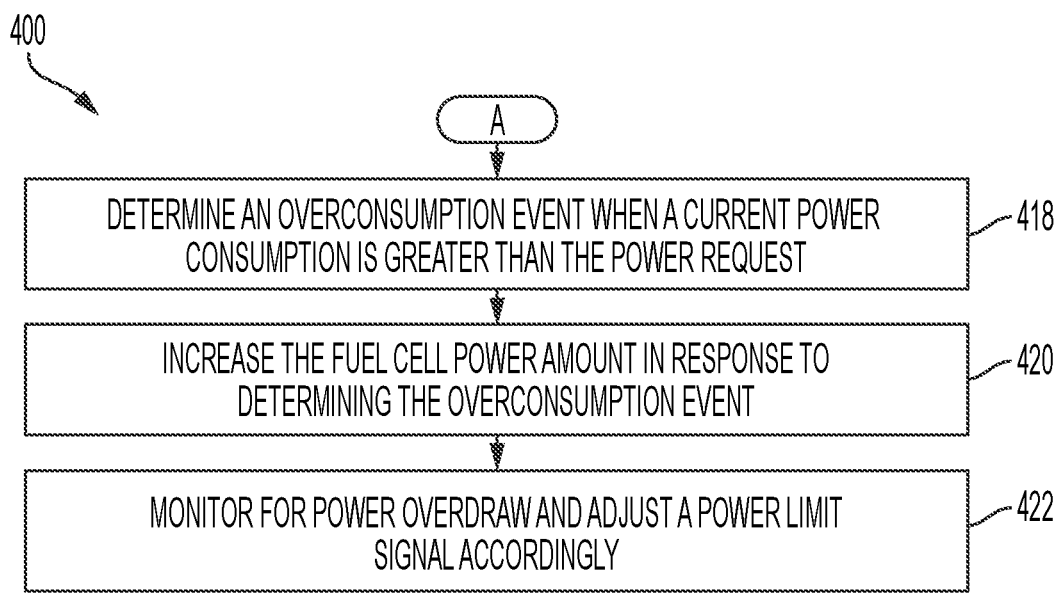

Referring now to FIGS. 4A and 4B, a method 400 for reducing the likelihood of overconsumption of power from a power source is shown. The method 400 may be implemented in a vehicle or system similar to the vehicle 100 or system 101 of FIG. 1 (in which a power source is designed and provided separately from other components of a vehicle).

The method 400 may begin in block 402 in which a battery stores electrical energy and a fuel cell circuit generates electrical energy. The electrical energy stored in the battery may be generated by the fuel cell circuit, may be received from a motor-generator (e.g., during regenerative braking), may be received from a wall outlet (e.g., in the case of a plug-in hybrid vehicle), or the like.

In block 404, a power source ECU (or another component) may receive a power request from a vehicle ECU. The power request may correspond to a total requested amount of power to satisfy any torque to be generated by a torque source and additional power to be used by auxiliary devices. In that regard, a vehicle ECU may receive the torque request from the power source as well as information corresponding to power draw by the auxiliary devices and may determine the power request based on this information. The vehicle ECU may then transmit the power request to the power source ECU. In some embodiments, the power source ECU may receive the torque request from the power source and the information from the auxiliary devices and may determine the power request itself based on this information. The power request may be updated periodically (e.g., every tenth of a second, every hundredth of a second), may be updated continuously, or the like.

In block 406, the power source ECU may determine a fuel cell power amount corresponding to an amount of power to be generated by the fuel cell that will satisfy the power request. It is desirable for as much of the power request to be provided by the fuel cell circuit as possible so the SOC of the battery may remain constant or may increase such that the battery is available to assist relatively large power requests and to supplement power while the fuel cell circuit ramps up. The power source ECU may determine the fuel cell power amount based on the power request. The power source ECU may also determine that the battery should provide supplemental power in various situations, and may determine a battery power amount to be output by the battery.

The torque source and auxiliary components may draw power from the power source during operation of the vehicle. As mentioned above, the power draw by the vehicle may be greater than or less than the power request. In that regard and in block 408, the battery may output supplemental power to cause the total power output by the power source to equal the power draw by the vehicle (e.g., the power used by the torque source as well as by the auxiliary components). In some embodiments, the power source may be designed for this additional power to be automatically provided by the battery and, in some embodiments, the power source ECU may control the battery to output this supplemental power.

In block 410, one or more sensor may detect data corresponding to a current power draw by the vehicle components (including the torque source and any auxiliary components). The data may correspond to only power that is drawn from the power source (i.e., along the bus 204 of FIG. 2). For example, the system may include a current, voltage, power, or other sensor that detects a current, voltage, power, or other electrical signal corresponding to the power flowing at least one of out of the power source (i.e., pushed onto the bus by the power source) or into the vehicle components (i.e., pulled from the bus by the vehicle components). The sensor may include a single sensor located on a bus, may include multiple sensors each associated with one or more component (e.g., a first sensor may be coupled to the fuel cell circuit to detect power flowing from the fuel cell circuit and a second sensor may be coupled to the battery to detect power flowing from the battery), or the like.

In some embodiments and in block 412, the system may use calculations rather than sensor data to determine the power draw by the vehicle components. For example, the power source ECU may calculate a current amount of power generated by the fuel cell circuit and calculate a current amount of power being output by the battery. In some embodiments, the power source ECU may calculate a rate of change in SOC of the battery (or a rate of change of power output by the battery) and use the rate of change to determine the power draw from the battery.

In block 414, the power source ECU may determine a total calculated power that is drawn from the power source based on the calculated or determined data from block 412. For example, the power source ECU may determine the total calculated power drawn from the power source by adding the calculated amount of power generated by the fuel cell circuit to the amount of power being drawn from the battery.

As another example, the power source ECU may determine the total calculated power being drawn from the power source based on the calculated power generated by the fuel cell circuit and the rate of change of the battery SOC (or the rate of change of power drawn from the battery). In some embodiments, the power source ECU may determine a total calculated power based on a combination of detected and calculated values. For example, the system may include a sensor that detects power being output by the battery such that the power source ECU determines the total calculated power by adding the sensor data to a calculated amount of power generated by the fuel cell stack.

In block 416, the power source ECU may determine a current power consumption based on at least one of the detected current power draw or the total calculated power. For example, the power source ECU may determine that the current power consumption is equal to the detected total current power being drawn from the power source. As another example, the power source ECU may determine that the current power consumption is equal to the total calculated power.

In block 418, the power source ECU may continue to monitor the current power consumption and the requested amount of power. The power source ECU may determine that an overconsumption event has occurred in response to the current power consumption being greater than the power request. As referenced above, the method 400 is applicable in situations in which the power source (i.e., a battery and fuel cell and potentially power source ECU) are provided separately from other vehicle components (such as a motor-generator and auxiliary components). Overconsumption is a problem that is specifically applicable to this situation because the power source and other components are unaware of what the other is doing (because they are designed separately, they fail to communicate the same as a system in which the power source and power sinks are co-designed).

In some embodiments, the power source ECU may only determine the presence of the overconsumption event in response to the current power consumption being greater than the power request for a predetermined amount of time. Waiting for the predetermined amount of time reduces the likelihood of a false overconsumption event caused by a brief change in requested power or a brief change in power generation by the fuel cell stack. For example, the fuel cell stack may take a certain amount of time to increase the generated power to a requested amount of power, and the battery may supplement the power during this period of time. The predetermined amount of time for the determination of overconsumption may be equal to or greater than this period of time for the fuel cell stack to increase generated power so as to reduce false determinations of overconsumption. Furthermore, the power source ECU may only determine the presence of the overconsumption event if the difference between current power consumption and power request being greater than a threshold difference for the predetermined amount of time. The threshold difference may be a power difference that is sufficiently great to noticeably reduce the SOC of the battery.

As mentioned above, the overconsumption is undesirable because the SOC of the battery may drop to or below a predetermined SOC threshold when the overconsumption event continues, causing the battery to be unavailable to provide supplemental power. In that regard and in block 420, the power source ECU may increase the fuel cell power amount in response to determining the overconsumption event. For example, the power source ECU may cause the fuel cell power amount to increase to be equal to the current power consumption. As another example, the power source ECU may cause the fuel cell power amount to increase to a value greater than the current power consumption in order to recharge the battery. In some situations, the fuel cell circuit may be incapable of generating an amount of power that is equal to the power consumption; in such situations the power source ECU may instruct the fuel cell circuit to maximize power generation and may instruct the vehicle ECU to reduce power consumption (or may alternatively instruct the fuel cell circuit to maximize power generation and instruct the battery to supplement the power generated by the fuel cell circuit).

In block 422, the power source ECU may continue to monitor for overconsumption by repeating some or all blocks of the method 400. Furthermore, the power source ECU may monitor for power overdraw events and may adjust a power limit signal based on determining a power overdraw event. The power overdraw event will be discussed in further detail below.

Figure 5A:
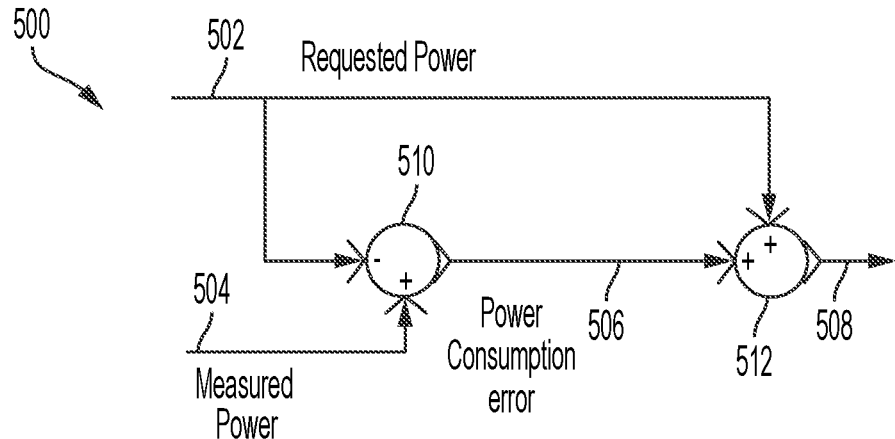
FIG. 5A is a logic diagram illustrating logic functions of the method of FIGS. 4A and 4B according to an embodiment of the present invention.
Figure 5B:
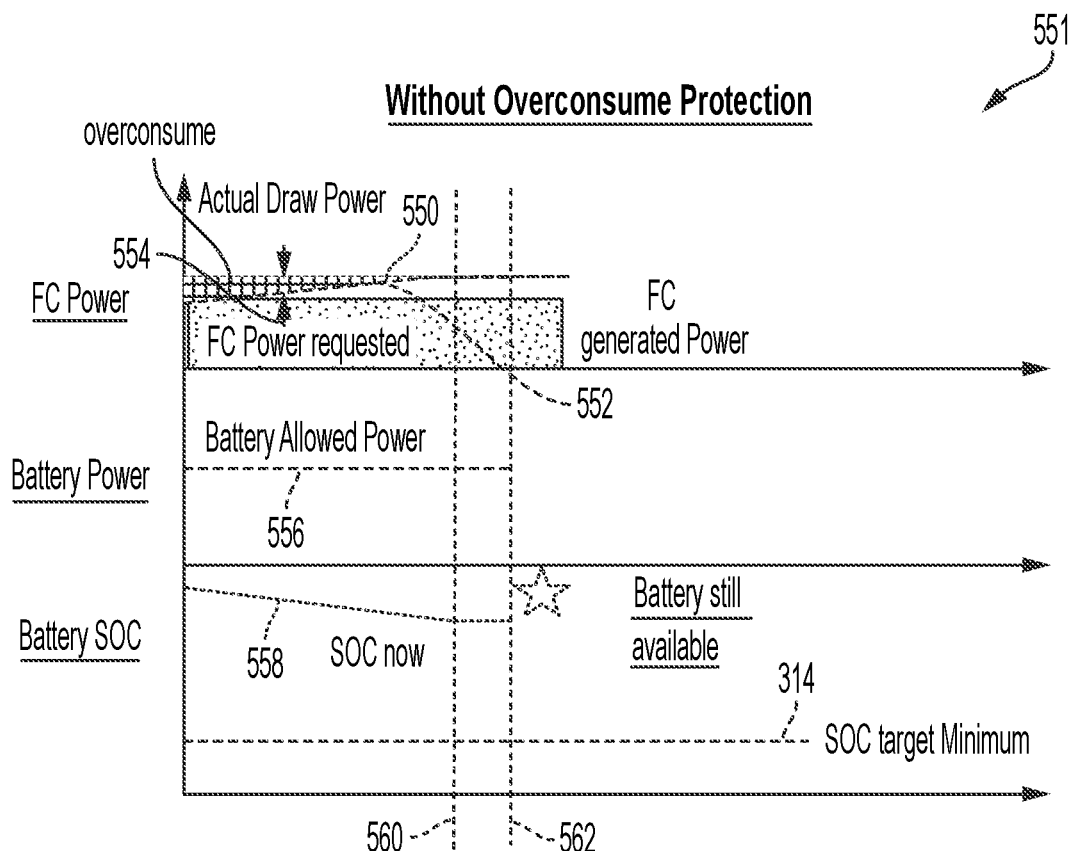
FIG. 5B is a chart illustrating how the method of FIGS. 4A and 4B reduce the likelihood of power overconsumption according to an embodiment of the present invention.

Referring now to FIGS. 5A and 5B, an exemplary implementation of the method 400 of FIGS. 4A and 4B is shown. FIG. 5A illustrates an exemplary logic diagram 500 for implementing the method 400 of FIGS. 4A and 4B, and FIG. 5B shows a chart 551 illustrating results of implementation of the method 400. In particular, the chart 551 illustrates how application of the method 400 to the chart 301 of FIG. 3 reduces or eliminates overconsumption.

As shown in the exemplary logic diagram 500, a power source ECU receives a power request signal 502 from a vehicle ECU. The power request signal 502 corresponds to a requested amount of power from the power source (e.g., a total requested power for a motor-generator and auxiliary components). The power source ECU may further determine or receive a current power consumption 504 that corresponds to an actual amount of power that is at least one of output by the power source or drawn by the vehicle components (e.g., by a motor-generator and auxiliary components). A difference block 510 calculates a difference between the power request signal 502 and the current power consumption 504, and outputs a power consumption error 506 that corresponds to the calculated difference. For example, if the requested power 502 is 5 megawatts (MW) and the current power consumption 504 is 7 MW then the power consumption error 506 is 2 MW. This power consumption error 506 of 2 MW may indicate an overconsumption event. As discussed above, the power source ECU may only determine the overconsumption event if the power consumption error 506 persists for a predetermined period of time.

In some embodiments, the power source ECU may further determine an underconsumption event based on the results of the difference block 510. For example, if the current power consumption 504 is less than the requested power 502 then the power source ECU may determine an underconsumption event. In some embodiments, the power source ECU may only monitor for overconsumption events and not underconsumption events. In some embodiments, the power source ECU may control the fuel cell stack to reduce an amount of generated power to match the power request in response to determining an underconsumption event.

In some embodiments, the power source ECU may only determine an underconsumption event if the power consumption error 506 exists for at least a predetermined amount of time. The predetermined amount of time is an amount of time which is sufficiently long to ensure that the power consumption error 506 is not caused by transitory changes in the power request signal 502 and the fuel cell circuit (e.g., to ensure an underconsumption event is not determined if the power consumption error 506 is due to the fuel cell circuit ramping down power generation in response to a reduction in the requested power 502).

In some embodiments, the power source ECU may only determine the presence of the underconsumption event if the difference between current power consumption and power request is greater than a threshold difference for the predetermined amount of time. The threshold difference may be a power value that sufficiently large to cause a noticeable amount of power waste (or to significantly increase the SOC of the battery).

In some embodiments, the power source ECU may not determine an underconsumption event unless the SOC of the battery is greater than or equal to an upper SOC threshold. The upper SOC threshold corresponds to an SOC of the battery that is sufficiently close to a maximum SOC of the battery that the SOC of the battery will reach or exceed the maximum SOC after limited charging. The power source ECU may not determine the underconsumption event before reaching the upper SOC threshold so the SOC of the battery increases such that the battery is available to later supplement power generated by the fuel cell circuit.

The logic diagram 500 may then add the power consumption error 506 to the requested power, resulting in a fuel cell power signal 508. The fuel cell power signal 508 may be provided to the fuel cell circuit to indicate a target amount of power to be generated by the fuel cell circuit. That is, the fuel cell power signal 508 may indicate a target amount of power to be generated by the fuel cell circuit, and the power source ECU may transmit the fuel cell power signal 508 to the fuel cell circuit.

Figure 3:
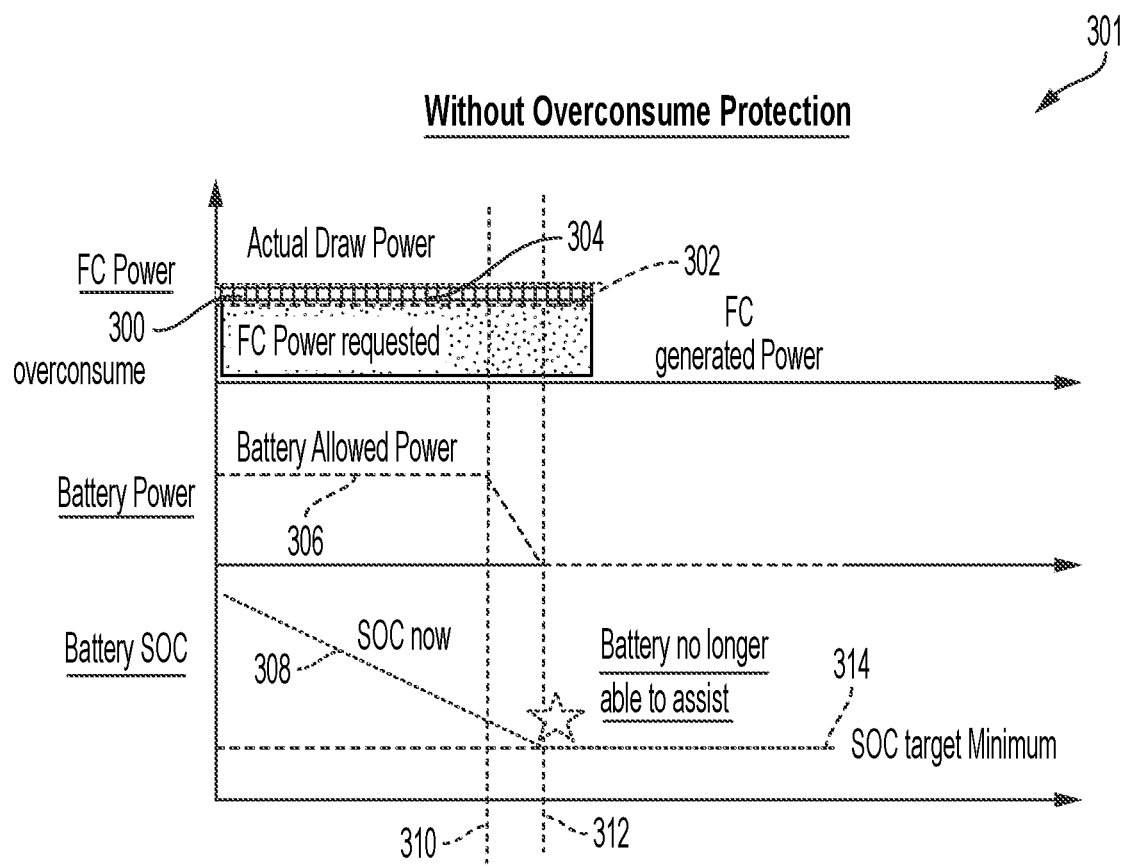
FIG. 3 is a chart illustrating power overconsumption in a vehicle lacking the system of FIG. 1 according to an embodiment of the present invention.

The chart 551 may begin in a similar manner as the chart 301 of FIG. 3. In particular, the power source ECU (along with additional components such as sensors) may detect, receive, or calculate an actual power draw 550 from the power source of the vehicle. The power source ECU may further determine a fuel cell generated power 552 corresponding to a current amount of power being generated by the fuel cell circuit. As shown in the chart 551, a power consumption error 554 exists between the actual power draw 550 and the fuel cell generated power 552.

However, the power source ECU may determine an overconsumption event in response to determining the power consumption error 554, and the power source ECU may control the fuel cell circuit to increase power generation to be equal to the actual power draw 550. As shown in the chart 551, the power consumption error 554 reduces to zero by a first time 560 and remains at zero through a second time 562.

As further shown, an SOC of the battery 558 reduces from the initial time until the first time 560 (because the battery is outputting power to compensate for the power consumption error). However, because the power consumption error 554 drops to zero at the first time 560, the SOC 558 ceases reducing at the first time 560 and remains constant through the second time 562. As shown, the SOC 558 fails to approach the minimum SOC threshold 314. Furthermore, the battery allowed power 556 remains constant, indicating that the battery may continue outputting power because the SOC 558 remains sufficiently greater than the minimum SOC threshold 314. Thus, FIG. 5B illustrates how the method 400 of FIGS. 4A and 4B reduces or eliminates overconsumption of power from a vehicle power source that is provided separately from other vehicle components.

Figure 6:
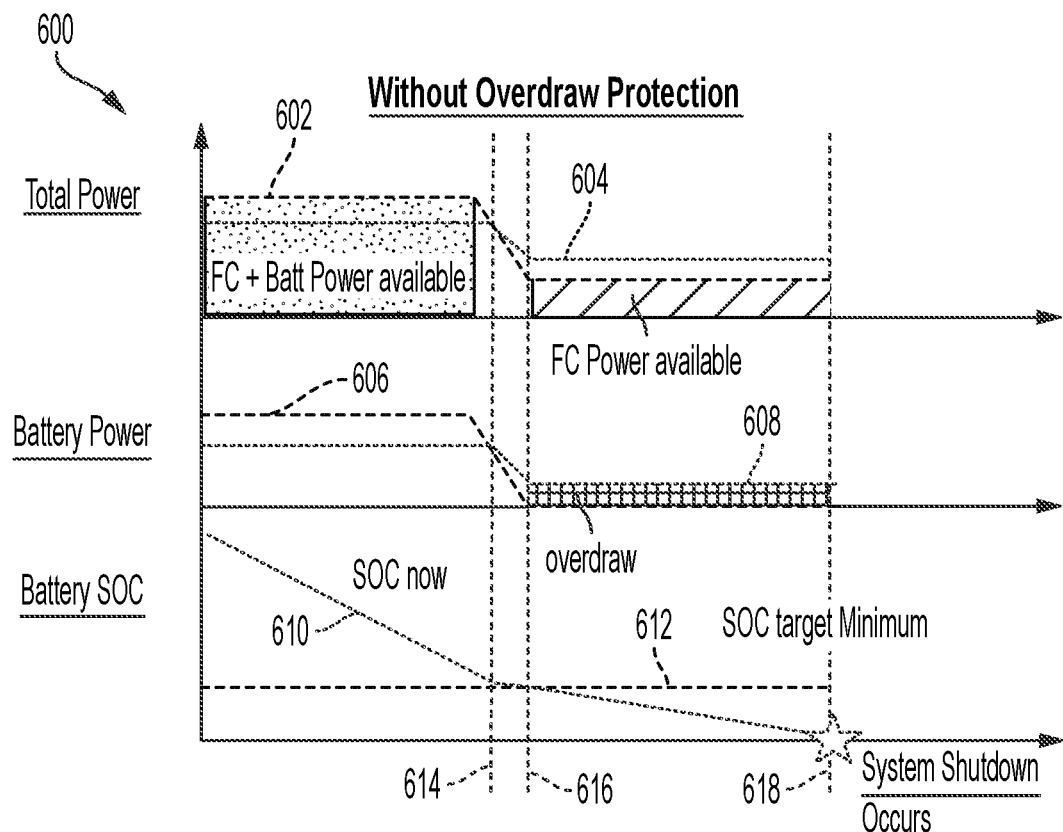
FIG. 6 is a chart illustrating power overdraw in a vehicle lacking the system of FIG. 1 according to an embodiment of the present invention.

Referring now to FIG. 6, a chart 600 illustrates results of overdrawing power from a power source provided separately from additional vehicle components when the power source fails to include overdraw protection. A first line 602 illustrates a power limit signal indicating a maximum amount of power that can be drawn from the power source (e.g., a battery and a fuel cell circuit), and a second line 604 illustrates a total power draw from the power source. The power limit signal is generated by a power source ECU and indicates a maximum amount of power that the power source can provide at a specific time. Because the power source is provided separately from other vehicle components, the vehicle ECU may draw more power from the power source than the power limit signal indicates, which causes the problem of power overdraw once the SOC has reached its target minimum.

The chart 600 further illustrates a battery allowed power 606 which corresponds to a maximum amount of power that can be provided by the battery at any given time. The battery allowed power 606 may be selected so as to cause the rate of change of battery power draw to be sufficiently below a maximum charging threshold charge level beyond which the battery may become damaged. The battery allowed power 606 may also be selected so as to reduce the likelihood of the SOC of the battery reaching or dropping below a minimum SOC threshold 612. The minimum SOC threshold 612 indicates a SOC level below which the battery may become damaged or operate improperly. Because the vehicle ECU may draw more power from the power source than the power limit signal indicates, the actual battery power draw 608 from the battery may be greater than the battery allowed power 606. This may undesirably result in the SOC of the battery 610 reaching or dropping below the minimum SOC threshold 618, causing at least one of a system shutdown or system damage.

In particular, between an initial time and second time 614, the total power draw 604 is less than the power limit signal 602, and the actual battery power draw 608 is less than the battery allowed power 606. During this time, the SOC 610 drops to nearly the minimum SOC threshold 612. At the first time 614, the total power draw 604 becomes the same as, and then greater than, the power limit signal 602. Likewise, the actual battery power draw 608 becomes the same as, and then greater than, the battery allowed power 606.

As shown, between the second time 614 and a third time 616, the battery allowed power 606 reaches zero as the SOC 610 approaches the minimum SOC threshold 612. However, because of the mismatch between the total power draw 604 and the power limit signal 602, the actual battery power draw 608 remains above the battery allowed power 606. This causes the SOC 610 to continue dropping below the minimum SOC threshold 612 until it reaches an absolute minimum SOC value at a fourth time 618 and becomes incapable of providing any power. This may result in a system shutdown of the power source, which is an undesirable situation. The results illustrated in FIG. 6 may be referred to as a system overdraw.

Figure 7A:
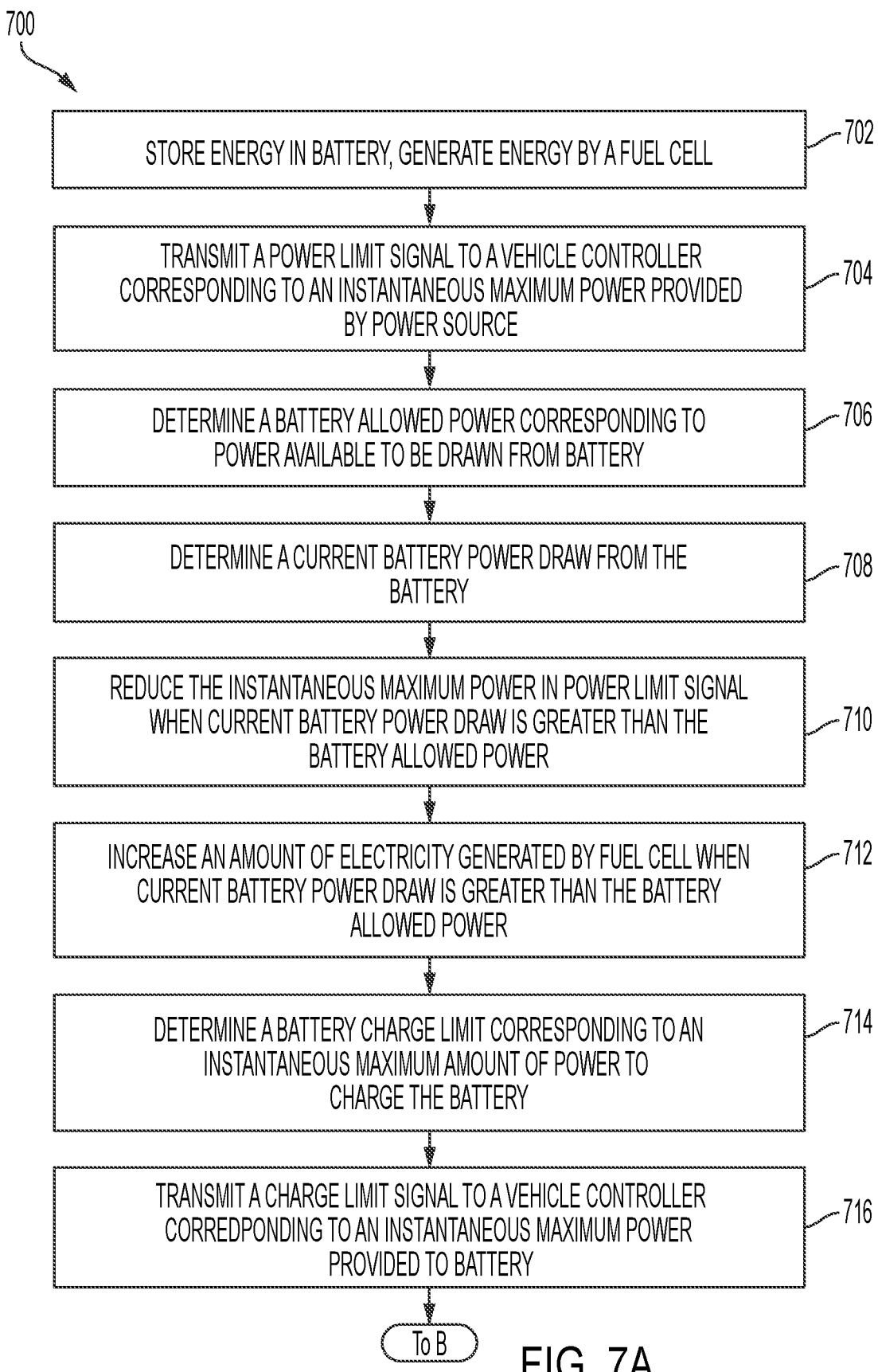
FIGS. 7A and 7B are flowcharts illustrating a method for reducing power overdraw in a vehicle according to an embodiment of the present invention.
Figure 7B:
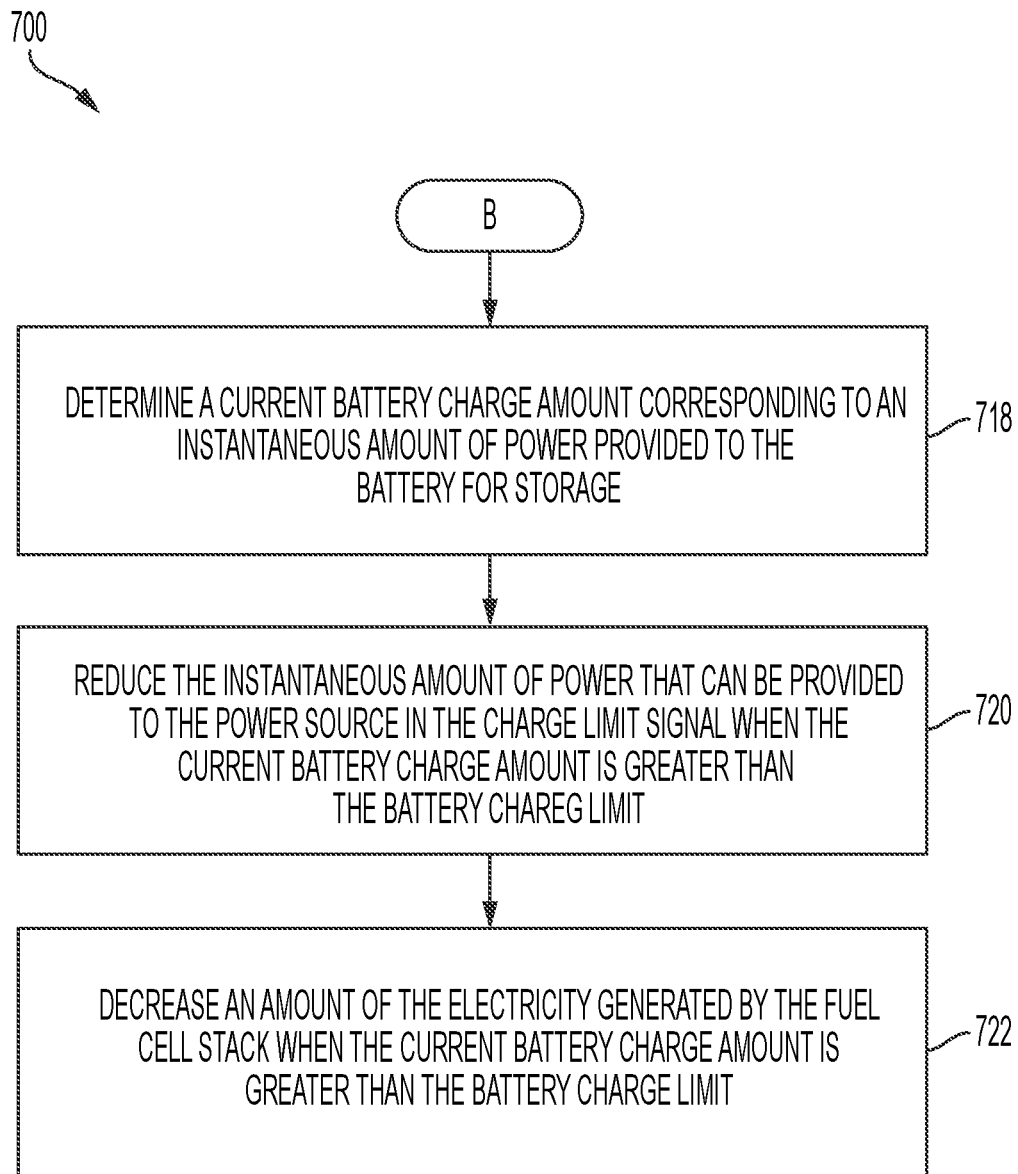

Turning to FIGS. 7A and 7B, a method 700 is shown for reducing or eliminating power overdraw by vehicle components that are provided separately from a power source of the vehicle. The method 700 may be implemented, for example, by a vehicle or system similar to the vehicle 100 or system 101 of FIG. 1.

In block 702, a battery may store electrical energy and a fuel cell circuit may generate electrical energy. The electrical energy stored in the battery may be generated by the fuel cell circuit, may be received from a motor-generator (e.g., during regenerative braking), may be received from a wall outlet (e.g., in the case of a plug-in hybrid vehicle), or the like.

In block 704, a power source ECU may determine a power limit signal. The power limit signal may indicate an instantaneous maximum amount of power that may be provided by the power source (i.e., a combined maximum amount of power that may be provided by a fuel cell circuit and by a battery). The power source ECU may transmit the determined power limit signal to a vehicle ECU. The vehicle ECU may control power consuming components of the vehicle based on the power limit signal. For example, the vehicle ECU may cause the total power that is consumed by the vehicle components to be less than or equal to the value of the power limit signal.

In block 706, the power source ECU may determine a battery allowed power. The battery allowed power corresponds to an amount of power that is available to be drawn from a battery. The power source ECU may determine the battery allowed power based on an SOC of the battery and based on an instantaneous maximum rate of change of SOC. For example, the battery allowed power may be adjusted such that the battery allowed power fails to cause the SOC of the battery to reach or exceed a minimum SOC threshold. The minimum SOC threshold is a SOC value below which the battery may become damaged or unusable.

The power source ECU may further set the battery allowed power to be less than or equal to a maximum rate of change of SOC. The maximum rate of change of SOC corresponds to a rate of change beyond which the battery or other components may become damaged or unusable. The battery allowed power may reduce as the SOC reaches the minimum SOC threshold and may approach zero in response to the SOC reaching the minimum SOC threshold. In some embodiments, the battery allowed power may reduce to zero before the SOC reaches the minimum SOC threshold such that the battery is available to provide supplemental power if needed.

In block 708, the power source ECU may determine a current battery power draw. The current battery power draw corresponds to an amount of power being drawn from the battery at the specific moment in time. The power source ECU may determine the current battery power in a number of manners. For example, the power source ECU may determine the current battery power using a voltage, current, or power sensor that detects an amount of voltage, current, or power being drawn by the battery. The power source ECU may then determine the current battery power based on the detected data. In some embodiments, the power source ECU may determine the current battery power based on a rate of change of SOC of the battery. For example, the power source ECU may determine a current rate of change of the SOC and may perform a calculation to convert the current SOC rate of change to a current power draw.

In block 710, the power source ECU may monitor the current battery power draw and the battery allowed power and may determine an overdraw event in response to the current battery power draw is greater than the battery allowed power. Because the power source is provided separately from the vehicle components that utilize electricity, the vehicle may lack a system capable of comparing the requested amount of power from the power source (which may be received from the vehicle ECU) to the actual amount of power draw from the power source. Thus, the overdraw event generally only presents an issue when the power source is provided separately from the additional vehicle components.

The SOC of the battery may continuously reduce in this overdraw state until it reaches or drops below the minimum SOC threshold. In response to the battery SOC reaching or dropping below the minimum SOC threshold, the battery may become damaged.

In response to determining an overdraw event, the power source ECU may reduce the instantaneous maximum amount of power in the power limit signal. In effect, this reduces the amount of power that the power source ECU says is available when the current battery power draw is greater than the battery allowed power, thus reducing the likelihood of an overdraw event. By reducing the maximum amount of power in the power limit signal, the power source ECU is instructing the vehicle ECU to reduce power consumption which, in turn, reduces power draw from the battery source. The power source ECU may implement the logic of block 710 using a proportional-integral-derivative (PID) controller such that the instantaneous maximum amount of power in the power limit signal is iteratively reduced until the current battery power draw is equal to or less than the battery allowed power.

Because the power source is provided separately from the remaining vehicle components (and is controlled by a separate ECU from the additional vehicle components), the power source ECU may not instruct the motor-generator or auxiliary components to reduce their power consumption. This issue fails to arise in conventional vehicles in which a single ECU controls a power source and vehicle components (or in which multiple ECUs are designed together to facilitate cross-communication). Thus, because the power source ECU cannot directly control power-consuming vehicle components, the power source ECU is designed to reduce the instantaneous maximum, amount of power in the power limit signal to achieve a similar effect (i.e., reducing power draw by the vehicle components).

In block 712, the power source ECU may further control the fuel cell circuit to increase power generation in response to determining an overdraw event. That is, the power source ECU may control the fuel cell circuit to increase power generation when the current battery power draw is greater than the battery allowed power. However, this control action may be insufficient to solve the overdraw event because the fuel cell circuit may be incapable of meeting the total energy draw of the vehicle components. Thus, the fuel cell circuit may be controlled to increase power generation to as high as possible to satisfy the total energy draw of the vehicle components, while the instantaneous maximum amount of power in the power limit signal is likewise reduced. This allows the power source to provide as much power as possible to the vehicle components while reducing or eliminating the likelihood of a system power overdraw.

In a similar manner as the overdraw, the system may likewise experience a system overcharge. A system overcharge occurs when the vehicle components (namely a generator of a motor-generator) provides a greater amount of electricity to store in the battery than the battery is capable of receiving. The following blocks may reduce or eliminate the likelihood of a system overcharge occurring.

In block 714, the power source ECU may determine a battery charge limit of the battery. The battery charge limit may include an instantaneous maximum amount of power that the battery may receive. The battery may be recharged using power from a generator of a motor-generator during regenerative braking. In particular, the battery charge limit may correspond to a rate of charging of the battery that causes the charge rate to remain at or below a maximum charge rate, and also prevents the SOC of the battery from reaching or exceeding a maximum SOC threshold. The battery charge limit may be adjusted periodically or continuously based on the current status of the power source (i.e., the SOC of the battery, the amount of power generation by the fuel cell circuit, and an amount of power flowing into or out of the power source). The battery charge limit may be an internal limit used by the power source ECU.

In block 716, the power source ECU may transmit a charge limit signal to a vehicle ECU. The charge limit signal may be related to the battery charge limit, and may correspond to an instantaneous maximum amount of power that can be provided to the battery. In contrast with the battery charge limit, the charge limit signal may be transmitted to the vehicle ECU and used by the vehicle ECU to adjust an amount of power that is provided to the power source to charge the battery. The charge limit signal may also correspond to a rate of charging of the battery that causes the charge rate to remain at or below a maximum charge rate, and also prevents the SOC of the battery from reaching or exceeding a maximum SOC threshold. Because the charge limit signal is separate from the battery charge limit, the two may be set to different values.

In block 718, the power source ECU may determine a current battery charge amount that corresponds to an instantaneous amount of power that is being provided to the battery for storage. The power source ECU may determine the current battery charge amount in a number of manners. For example, the power source ECU may determine the current battery charge amount using a voltage, current, or power sensor that detects an amount of voltage, current, or power being drawn by the battery. This sensor may be the same as the sensor that detects the current battery power from block 708. The power source ECU may determine whether the voltage, current, or power is a battery charge amount when the SOC of the battery increases and a current battery power when the SOC decreases. The power source ECU may then determine the current battery charge amount based on the detected data. In some embodiments, the power source ECU may determine the current battery charge amount based on a rate of change of SOC of the battery. For example, the power source ECU may determine a current rate of change of the SOC and may perform a calculation to convert the current SOC rate of change to a current power charge amount.

In block 720, the power source ECU may determine a system overcharge event in response to the current battery charge amount being greater than the battery charge limit (the internal power source ECU value). The power source ECU may compare the current battery charge amount to the battery charge limit in a similar manner as it compares the current battery power draw to the battery allowed power in block 710. The power source ECU may further reduce the instantaneous amount of power in the charge limit signal in response to determining the system overcharge event. That is, the power source ECU may reduce the instantaneous amount of power in the charge limit signal when the power source ECU determines that the current battery charge amount is greater than the battery charge limit. The power source ECU may continuously or periodically reduce the instantaneous amount of power using a PID controller until the current battery charge amount is equal to or less than the battery charge limit. This reduces the likelihood of a system overcharge, which in turn reduces the likelihood of the battery becoming damaged or unusable.

In some embodiments, the fuel cell circuit may generate power while a generator is also generating power during a battery charge event. In such situations and in block 722, the power source ECU may control the fuel cell circuit to decrease an amount of electricity that is being generated when the power source ECU determines the overcharge event. This reduction in power generated by the fuel cell circuit reduces a total amount of power being provided to the battery for charging, thus causing the current battery charge amount to more quickly drop to or below the battery charge limit.

Figure 8A:
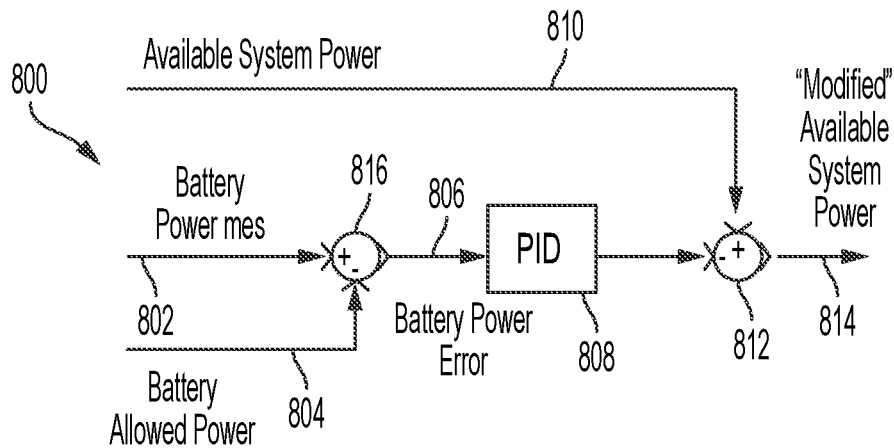
FIG. 8A is a logic diagram illustrating logic functions of the method of FIGS. 7A and 7B according to an embodiment of the present invention.
Figure 8B:
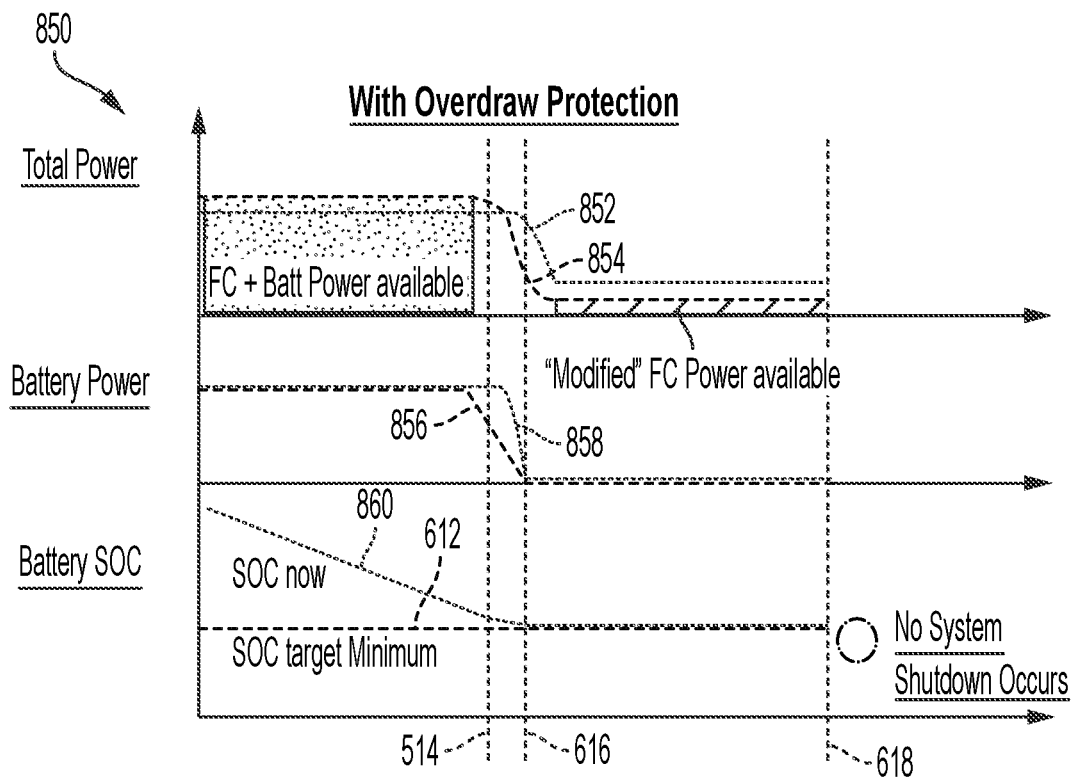
FIG. 8B is a chart illustrating how the method of FIGS. 7A and 7B reduce the likelihood of power overdraw according to an embodiment of the present invention.

Referring now to FIGS. 8A and 8B, an exemplary implementation of the method 700 of FIGS. 7A and 7B is shown. FIG. 8A illustrates an exemplary logic diagram 800 for implementing the method 700 of FIGS. 7A and 7B, and FIG. 8B shows a chart 800 illustrating results of implementation of the method 700. In particular, the chart 800 illustrates how application of the method 700 to the chart 600 of FIG. 6 reduces or eliminates system overdraw.

In the logic diagram 800, a comparator 816 receives a measured battery power 802 (referred to as the current battery power draw or current battery charge amount in FIGS. 7A and 7B) as well as a battery allowed power 804 (referred to as the battery allowed power and the battery charge limit in FIGS. 7A and 7B). The comparator determines a difference between the measured battery power 802 and the battery allowed power 804 and outputs a battery power error 806. The battery power error 806 then corresponds to the difference between the measured battery power 802 and the battery allowed power 804, and may correspond to either an overdraw event or an overcharge event.

The battery power error 806 may be provided to a PID controller 808. The output of the PID controller 808 may be compared with an available system power 810 by a comparator 812. The available system power 810 corresponds to the battery allowed power and the battery charge limit of FIGS. 7A and 7B. The comparator 812 may subtract the output of the PID controller 808 from the available system power 810, and outputs a modified available system power 814. The modified available system power 814 corresponds to the power limit signal and the charge limit signal of FIGS. 7A and 7B. The PID controller 808 may iteratively drive the measured battery power 802 to be less than or equal to the battery allowed power 804 to reduce or eliminate the likelihood of a system overdraw occurring. The modified available system power 814 may be provided to a vehicle ECU in order to cause the vehicle ECU to request a reduced amount of power from the power source until the measured battery power 802 is less than or equal to the battery allowed power 804.

The chart 850 may begin in a similar state as the chart 600 of FIG. 6. In particular and between an initial time and a second time 614, the total power draw 852 is less than the power limit signal 854, and the actual battery power draw 858 is less than or equal to the battery allowed power 856. However, as the time advances from the second time 614 to the third time 616, the SOC 860 approaches the minimum SOC threshold 612. Similarly, the actual battery power draw 858 becomes greater than the battery allowed power 856. In response, the power source ECU reduces the power limit signal 854 between the second time 614 and the third time 616 so the actual battery power draw 858 reduces to or below the battery allowed power 856. This reduces the likelihood of the SOC 860 reaching or dropping below the minimum SOC threshold 612. Thus, the power source ECU avoids the system overdraw by adjusting the power limit signal 854.

Where used throughout the specification and the claims, "at least one of A or B" includes "A" only, "B" only, or "A and B." Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A system for reducing overconsumption of power from a vehicular power source, the system comprising:
    a power source including:
        a battery configured to store energy and having a state of charge (SOC), and
        a fuel cell stack configured to generate electricity at least one of to be utilized by a motor or to be stored in the battery; and
    a power source electronic control unit (ECU) coupled to the power source and configured to:
        receive a power request corresponding to a requested amount of power from the power source,
        determine a fuel cell power amount corresponding to an amount of the electricity generated by the fuel cell stack to achieve the requested amount of power,
        determine an overconsumption event when a current power consumption corresponding to a total amount of power being drawn from the power source is greater than the requested amount of power of the power request due to a miscommunication between the power source and one or more vehicle components causing the power request, and
        increase the fuel cell power amount in response to determining the overconsumption event.

2. The system of claim 1 wherein the power source ECU is further configured to iteratively increase the fuel cell power amount until the fuel cell power amount is equal to the current power consumption.

3. The system of claim 1 wherein the battery is further configured to output supplemental power that supplements the fuel cell power amount to cause the power source to meet the current power consumption when the current power consumption is greater than the requested amount of power of the power request.

4. The system of claim 3 wherein the power source ECU is further configured to determine the overconsumption event in response to the SOC of the battery decreasing.

5. The system of claim 1 further comprising at least one sensor configured to detect power data corresponding to the total amount of power being drawn from the power source, wherein the power source ECU is further configured to determine the overconsumption event by comparing the detected power data to the power request.

6. The system of claim 1 wherein the power source ECU is further configured to:
    determine a battery power output amount;
    determine a total calculated power being drawn from the power source by adding the battery power output amount to the fuel cell power amount; and
    determine the overconsumption event by comparing the total calculated power to the power request.

7. The system of claim 1 wherein the system is configured to be implemented in a vehicle manufactured separately from the system such that the power source ECU is configured to communicate with and receive the power request from a vehicle ECU that controls operation of the motor of the vehicle.

8. The system of claim 1 wherein increasing the fuel cell power amount in response to determining the overconsumption event reduces the likelihood of the SOC of the battery reaching or dropping below a lower SOC threshold.

9. The system of claim 1 wherein the power source ECU is further configured to cause the fuel cell stack to output the fuel cell power amount.

10. A system for reducing overconsumption of power from a vehicular power source, the system comprising:
- a motor configured to convert electricity into mechanical power;
- a power source including:
  - a battery configured to store energy and having a state of charge (SOC), and
  - a fuel cell stack configured to generate electricity at least one of to be utilized by the motor or to be stored in the battery;
- a vehicle electronic control unit (ECU) coupled to the motor and configured to control operation of the motor and to generate a power request corresponding to a requested amount of power from the power source; and
- a power source ECU coupled to the power source and the vehicle ECU and configured to:
  - receive the power request from the vehicle ECU,
  - determine a fuel cell power amount corresponding to an amount of the electricity generated by the fuel cell stack to achieve the requested amount of power,
  - determine an overconsumption event when a current power consumption corresponding to a total amount of power being drawn from the power source is greater than the requested amount of power of the power request due to a miscommunication between the power source and the motor, and
  - increase the fuel cell power amount in response to determining the overconsumption event.

11. The system of claim 10 wherein the battery is further configured to output supplemental power that supplements the fuel cell power amount to cause the power source to meet the current power consumption when the current power consumption is greater than the requested amount of power of the power request, and the power source ECU is further configured to determine the overconsumption event in response to the SOC of the battery decreasing.

12. The system of claim 10 further comprising at least one sensor configured to detect power data corresponding to the total amount of power being drawn from the power source, wherein the power source ECU is further configured to determine the overconsumption event by comparing the detected power data to the power request.

13. The system of claim 10 wherein the power source ECU is further configured to:
- determine a battery power output amount;
- determine a total calculated power being drawn from the power source by adding the battery power output amount to the fuel cell power amount; and
- determine the overconsumption event by comparing the total calculated power to the power request.

14. A method for reducing overconsumption of power from a vehicular power source, the method comprising:
- storing, in a battery, energy;
- generating, by a fuel cell stack, electricity to be at least one of utilized by a motor or stored in the battery, the battery and the fuel cell stack together being a power source;
- receiving, by a power source electronic control unit (ECU), a power request corresponding to a requested amount of power from the power source;
- determining, by the power source ECU, a fuel cell power amount corresponding to an amount of the electricity generated by the fuel cell stack to achieve the requested amount of power;
- determining, by the power source ECU, an overconsumption event when a current power consumption corresponding to a total amount of power being drawn from the power source is greater than the requested amount of power of the power request due to a miscommunication between the power source and one or more vehicle components causing the power request; and
- increasing, by the power source ECU, the fuel cell power amount in response to determining the overconsumption event.

15. The method of claim 14 wherein increasing the fuel cell power amount includes iteratively increasing the fuel cell power amount until the fuel cell power amount is equal to the current power consumption.

16. The method of claim 14 further comprising outputting, by the battery, supplemental power that supplements the fuel cell power amount to cause the power source to meet the current power consumption when the current power consumption is greater than the requested amount of power of the power request.

17. The method of claim 16 wherein determining the overconsumption event includes determining the overconsumption event in response to a state of charge (SOC) of the battery decreasing.

18. The method of claim 14 further comprising detecting, by at least one sensor, power data corresponding to the total amount of power being drawn from the power source, wherein determining the overconsumption event is performed by comparing the detected power data to the power request.

19. The method of claim 14 further comprising:
- determining, by the power source ECU, a battery power output amount; and
- determining, by the power source ECU, a total calculated power being drawn from the power source by adding the battery power output amount to the fuel cell power amount,
- wherein determining the overconsumption event is performed by comparing the total calculated power to the power request.

20. The method of claim 14 further comprising communicating, by the power source ECU, with a vehicle ECU that controls operation of the motor and receiving, by the power source ECU, the power request from the vehicle ECU.

* * * * *